United States Patent

Kinsman

[11] Patent Number: 6,140,696
[45] Date of Patent: Oct. 31, 2000

[54] VERTICALLY MOUNTABLE SEMICONDUCTOR DEVICE AND METHODS

[75] Inventor: Larry D. Kinsman, Boise, Id.

[73] Assignee: Micron Technology, Inc., Boise, Id.

[21] Appl. No.: 09/014,053

[22] Filed: Jan. 27, 1998

[51] Int. Cl.[7] .......................... H01L 23/02; H01L 23/48; H01L 23/52; H05K 7/02
[52] U.S. Cl. .......................... 257/678; 257/693; 257/737; 257/779; 257/782; 361/760; 361/767
[58] Field of Search .................................... 257/685, 686, 257/693; 438/613; 361/760, 767; 228/180.22; 277/767, 737, 782, 784, 786, 776, 779

[56] References Cited

U.S. PATENT DOCUMENTS

| | | | |
|---|---|---|---|
| Re. 34,794 | 11/1994 | Farnworth | 343/876 |
| 3,624,587 | 11/1971 | Conrad | 361/803 |
| 5,444,294 | 8/1995 | Suzuki | 257/666 |
| 5,444,304 | 8/1995 | Hara et al. | 257/796 |
| 5,450,289 | 9/1995 | Kweon et al. | 257/692 |
| 5,451,815 | 9/1995 | Taniguchi et al. | 257/696 |
| 5,468,991 | 11/1995 | Lee et al. | 257/666 |
| 5,592,019 | 1/1997 | Ueda et al. | 257/666 |
| 5,619,067 | 4/1997 | Sua et al. | 257/686 |
| 5,635,760 | 6/1997 | Ishikawa | 257/692 |
| 5,668,409 | 9/1997 | Gaul | 257/723 |
| 5,889,658 | 3/1999 | Sullivan et al. | 257/692 |
| 5,940,277 | 8/1999 | Farnworth et al. | 361/760 |

*Primary Examiner*—Mahshid Saadat
*Assistant Examiner*—Jhihan B Clark
*Attorney, Agent, or Firm*—Trask, Britt & Rossa

[57] ABSTRACT

A vertically mountable semiconductor device including a plurality of bond pads disposed proximate to a single edge thereof. The bond pads are bumped with an electrically conductive material. The semiconductor device may also include a support member. Alternatively, the semiconductor device may be laminated to one or more adjacent semiconductor devices. The present invention also includes a method of attaching the semiconductor device to a carrier substrate. Preferably, solder paste is applied to terminals on the carrier substrate. The semiconductor device is oriented vertically over the carrier substrate, such that the bumped bond pads align with their corresponding terminals. The bumps are placed into contact with the solder paste. The bumps and solder paste are then fused to form a joint between each of the bond pads and respective terminal, establishing an electrically conductive connection therebetween and imparting structural stability to the semiconductor device.

21 Claims, 2 Drawing Sheets

VERTICALLY MOUNTABLE SEMICONDUCTOR DEVICE AND METHODS

FIELD OF THE INVENTION

The present invention relates to chip-on-board assemblies. Particularly, the present invention relates to vertically mountable, bare or minimally packaged semiconductor devices. The semiconductor devices to which the present invention relates include bond pads proximate an edge thereof. In use, the solder bump establishes an electrical connection with a terminal of a carrier substrate, and supports the semiconductor device perpendicularly relative to the carrier substrate.

BACKGROUND OF THE RELATED ART

The direct attachment of a semiconductor device to a circuit board is known in the art as chip-on-board technology. Semiconductor devices that are directly mountable to a circuit board typically include bond pads along more than one edge thereof or in an area array over the active surface thereof. Methods for attaching semiconductor devices directly to a circuit board include flip-chip technology and tape automated bonding. Typically, when those techniques are employed, a semiconductor device is oriented over the circuit board and substantially parallel thereto in order to establish an electrical connection between the semiconductor device and the circuit board. After connecting such a semiconductor device to a circuit board, a protective coating may be applied over the semiconductor device.

However, the placement of a semiconductor device directly against a circuit board is somewhat undesirable in that, due to the parallel orientation of the semiconductor device relative to the circuit board and the typical placement of the semiconductor device's active surface thereagainst, heat must pass through both the circuit board and the semiconductor device in order to dissipate from the semiconductor device. Thus, the transfer of heat away from the semiconductor device is relatively slow. The horizontal orientation of the semiconductor device also consumes a great deal of "real estate" or area on the circuit board.

Vertical surface mount packages are also known in the art. When compared with traditional, horizontally mountable semiconductor packages and chip-on-board semiconductor devices, many vertical surface mount packages have a superior ability to transfer heat away from the semiconductor device. Vertical surface mount packages also consume less area on a circuit board than a horizontally mounted package of the same size. Thus, many skilled individuals in the semiconductor industry are finding vertical surface mount packages more desirable than their traditional, horizontally mountable counterparts and horizontally mountable chip-on-board devices.

The following United States Patents disclose various exemplary vertical surface mount packages: U.S. Pat. No. Re. 34,794, issued to Warren M. Farnworth on Nov. 22, 1994; U.S. Pat. No. 5,444,304, issued to Kouija Hara and Jun Tanabe on Aug. 22, 1995; U.S. Pat. No. 5,450,289, issued to Yooung D. Kweon and Min C. An on Sep. 12, 1995; U.S. Pat. No. 5,451,815, issued to Norio Taniguchi et al. on Sep. 19, 1995; U.S. Pat. No. 5,592,019, issued to Tetsuya Ueda et al. on Jan. 7, 1997; and U.S. Pat. No. 5,635,760, issued to Toru Ishikawa on Jun. 3, 1997.

Many vertical surface mount packages in the prior art are somewhat undesirable in that they include leads which operatively connect a semiconductor device to a circuit board. The leads of such devices tend to increase the impedance and decrease the overall speed with which a device conducts electrical signals. Moreover, the packaging of many such devices adds to their undesirability. Typically, packaging requires multiple additional manufacturing steps, which translates into increased production costs. The packaging of many vertical surface mount packages also tends to consume a substantial amount of space on the circuit board.

U.S. Pat. No. 5,668,409 (the "'409 patent"), issued to Stephen Joseph Gaul on Sep. 16, 1997, discloses a vertically mountable, bare semiconductor die which includes bond pads along the edge thereof. The '409 patent discloses vertical mounting of that device to a circuit board by solder reflow techniques. However, that device is somewhat undesirable in that fabrication thereof requires several additional steps relative to the fabrication of typical chip-on-board semiconductor devices. The requirement of additional fabrication steps, and the related requirement of additional fabrication materials, increases the manufacturing cost of such semiconductor devices.

Thus, a vertically mountable bare semiconductor device is needed which has reduced impedance relative to devices in the prior art, has good thermal conductivity, and consumes less space on a circuit board. A method of mounting a bare or minimally packaged semiconductor device perpendicularly relative to a circuit board is also needed.

SUMMARY OF THE INVENTION

The semiconductor device of the present invention includes bond pads disposed proximate a single edge thereof. Placement of the bond pads proximate an edge of the semiconductor device facilitates direct vertical mounting of the semiconductor device to a carrier substrate. Thus, when such a semiconductor device is substantially perpendicularly mounted to a carrier substrate, packaging and leads are not necessary to establish an electrical connection between the bond pads and the corresponding terminals on the carrier substrate. The direct connection between the bond pads and substrate board contacts also imparts to the semiconductor device assembly of the present invention a low impedance characteristic.

A preferred mounting method according to the present invention includes the placement of a brick of solder paste on the carrier substrate terminals, orienting the semiconductor device perpendicularly relative to the carrier substrate, aligning the bond pads of the semiconductor device with their corresponding terminals, establishing contact between the bumps and the solder paste, and heating the bumps and solder paste to re-flow the solder and attach the bond pads to their respective terminals.

Other advantages of the present invention will become apparent through a consideration of the appended drawings and the ensuing description.

DETAILED DESCRIPTION OF THE PREFERRED EMBODIMENTS

Figure 1:
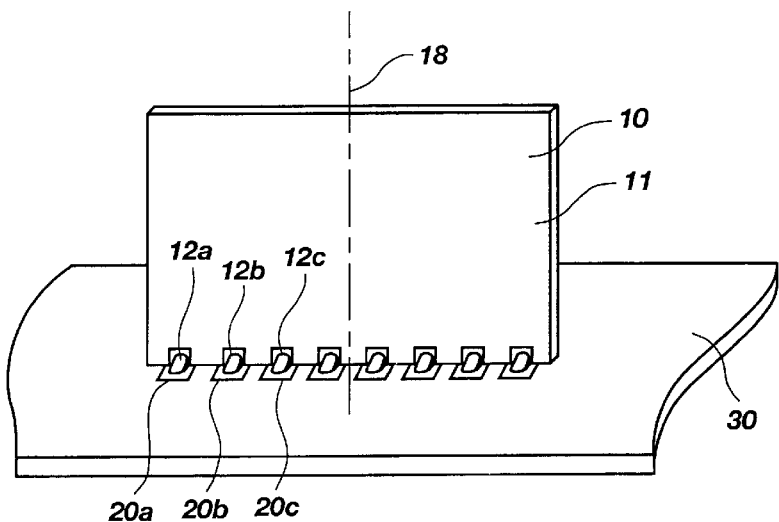
FIG. 1 is a frontal perspective view of a first embodiment of a semiconductor device-carrier substrate assembly according to the present invention.

FIG. 1 illustrates a semiconductor device 10 which has been vertically mounted to a carrier substrate 30. Solder joints 20a, 20b, 20c, etc. support semiconductor device 10 relative to carrier substrate 30.

Figure 2:
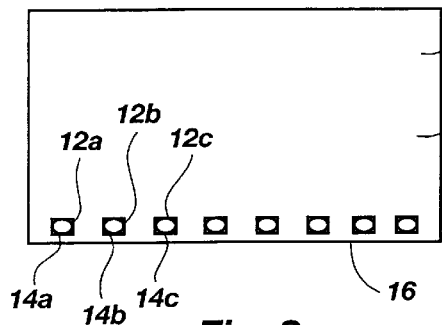
FIG. 2 is a front plan view of a first embodiment of a semiconductor device for use in the present invention.

Referring to FIG. 2, semiconductor device 10 is a semiconductor device of the type known and used in the industry, which includes circuit traces and active elements. The bond pads 12a, 12b, 12c, etc. of semiconductor device 10 are disposed on active surface 11, adjacent to a single edge 16 of the semiconductor device. Preferably, bond pads 12a, 12b, 12c, etc. are arranged in-line. Bond pads 12a, 12b, 12c, etc. may be disposed a short distance from edge 16, or their lower edges may be flush with the edge. Thus, during fabrication of semiconductor device 10, bond pads 12a, 12b, 12c, etc. are redirected to a location which is adjacent to edge 16. Methods and mechanisms which are known to those of ordinary skill in the art are useful for manufacturing semiconductor devices which are useful in the package according to the present invention. Such methods include the formation of electrical traces which lead to edge 16 and the fabrication of bond pads 12a, 12b, 12c, etc. adjacent to edge 16. Preferably, the fabrication steps which precede the formation of the electrical traces that lead to bond pads 12a, 12b, 12c, etc. and the formation of the bond pads are unchanged from their equivalent steps in the fabrication of prior art semiconductor devices. Thus, existing semiconductor device designs are useful in the package of the present invention with little modification and no increase in the number of fabrication steps.

A first semiconductor device 10 has a standardized number of bond pads 12a, 12b, 12c, etc., which are spaced apart from one another at a standardized pitch, and which may be positioned at a specific location relative to a center line 18 of the semiconductor device, or relative to any other landmark on the semiconductor device, such as a side thereof. Alternatively, semiconductor device 10 may include a non-standardized number and lateral spacing of bond pads 12. The placement of bond pads 12a, 12b, 12c, etc. proximal to edge 16 imparts semiconductor device 10 with reduced impedance as the bond pads are electrically connected the carrier substrate (reference character 30 of FIG. 1), relative to many vertical surface mount packages and other packaged semiconductor devices in the prior art.

Preferably, bond pads 12a, 12b, 12c, etc. each include a bump 14a, 14b, 14c, etc. formed thereon. Bumps 14a, 14b, 14c, etc. are preferably formed from gold, gold alloy, or solder by techniques which are known in the art.

Figure 3A:
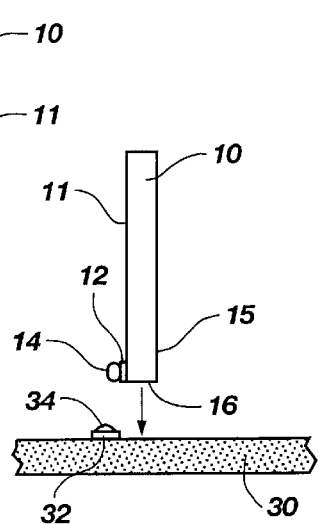
FIG. 3a is a side plan view of the semiconductor device of FIG. 2, illustrating placement of the semiconductor device on a carrier substrate.
Figure 3B:
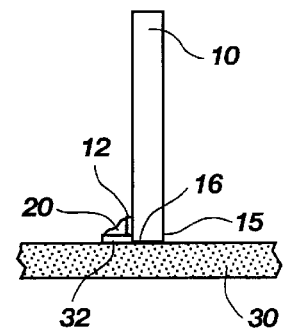
FIG. 3b is a side plan view of the semiconductor device of FIG. 2, illustrating a first preferred attachment of the semiconductor device to the carrier substrate.

With reference to FIG. 3a, a brick of solder paste 34 is disposed on each terminal 32 of carrier substrate 30. Typically, solder paste 34 is a mixture of solder powder, flux and a binder which keeps the solder powder and flux together. The preferred solder paste 34 and bump 14 materials have matched impedance to ensure optimum conditions for the transfer of electrical signals from carrier substrate 30 to semiconductor device 10 and from the semiconductor device to the carrier substrate. Preferably, solder paste 34 is applied to terminals 32 by techniques which are known in the art, including without limitation, screen printing, stencil printing, pressure dispensing, and the use of solder preforms.

As semiconductor device 10 is positioned on carrier substrate 30, bump 14 contacts solder paste 34. Bump 14 and solder paste 34 are fused together to form a solder joint 20, which is also referred to as an electrically conductive joint. Solder joint 20 physically supports semiconductor device 10 relative to carrier substrate 30 in substantially a vertical orientation with respect thereto, and electrically connects bond pads 12 to their corresponding terminals 32. Preferably, known solder reflow techniques are employed to form solder joint 20. Solder reflow techniques include, but are not limited to, vapor-phase, infrared, hot gas, and other reflow methods. Other known soldering techniques are also useful for fusing bump 14 and solder paste 34 to electrically connect bond pad 12 to terminal 32. Alternatively, an electrically conductive joint 20 may be formed by placing a connector of electrically conductive epoxy or any other conductive element, including without limitation electrically conductive epoxies and z-axis elastomers, in contact with both bond pad 12 and terminal 32.

Figure 4A:
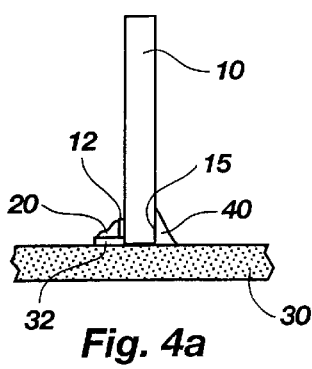
FIG. 4a is a side plan view of the semiconductor device of FIG. 2, illustrating an alternative embodiment of a support member between the semiconductor device and the carrier substrate.

Referring now to FIG. 4a, one or more support joints 40, which are also referred to as support footings or support members, may be placed between surface 15 of semiconductor device 10 and carrier substrate 30 (i.e., on the side of the semiconductor device opposite electrically conductive joint 20) to impart additional structural stability to the semiconductor device by stabilizing it from both sides. Preferably, support joint 40 is formed from materials such as epoxy potting compounds, acrylic compounds, silicone materials, resinous molding compounds, or other polymeric plastic materials which are known in the art. Preferably, the amount of material used to form support joint 40 is sufficient to support semiconductor device 10, yet minimal in order to optimize the transfer of heat away from the semiconductor device and preserve surface area on the carrier substrate.

Figure 4B:
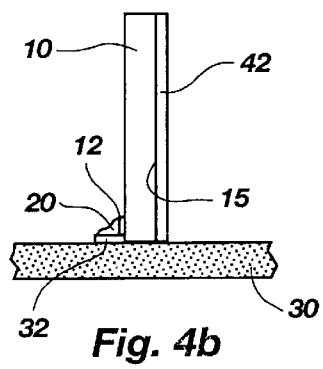
FIG. 4b is a side plan view of the semiconductor device of FIG. 2, illustrating an alternative embodiment of a support member between the semiconductor device and the carrier substrate.

Referring to FIG. 4b, alternatively or in combination with support joint 40, semiconductor device 10 may include a support layer 42, which is also referred to as a support member, on at least a portion of surface 15. Support layer 42 imparts additional structural support to semiconductor device 10. The materials which are useful for forming support joint 40 are also useful for forming support layer 42. Support layer 42 may be applied to surface 15 by techniques which are known in the art, including without limitation, lamination and adhesive bonding. Alternatively, support layer 42 may be manufactured from materials having good thermal conductivity, such as copper, aluminum, other metals, metal alloys, and ceramics.

Figure 5A:
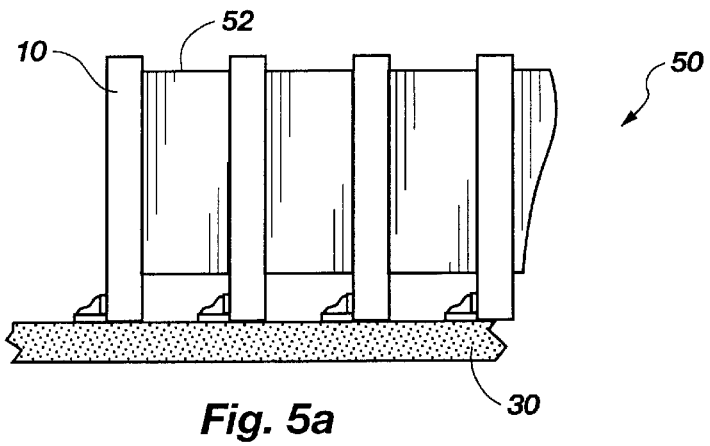
FIG. 5a is a side plan view of a series of laminated semiconductor devices.
Figure 5B:
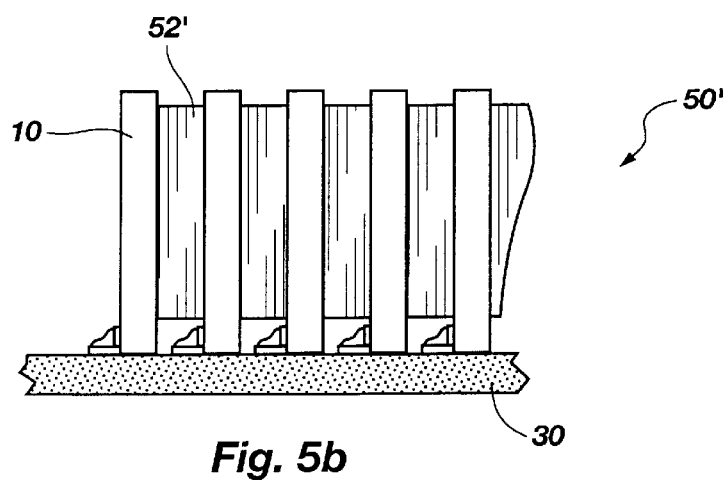
FIG. 5b is a side plan view of an alternative embodiment of a series of laminated semiconductor devices.

FIGS. 5a and 5b illustrate a laminated module 50 which includes a plurality of adjacent semiconductor devices 10 that is bonded together with a layer of laminate 52. When mounted to carrier substrate 30, laminated module 50 has greater structural stability than a vertically mounted semiconductor device such as that illustrated in FIG. 1. Laminate 52 may be formed from the same types of materials that are useful as support layer 42, described above in reference to FIG. 4b. Preferably, laminate 52 is manufactured from a material which is a good thermal conductor. Thus, during operation of each semiconductor device 10, laminate 52 facilitates the transfer of heat away from the semiconductor devices attached thereto.

The laminates 52 and 52' of FIGS. 5a and 5b, respectively, have different thicknesses. Thinner laminates 52' are preferred from the standpoint that the number of semiconductor devices 10 that are attachable to a given area of the carrier substrate 30 is maximized as the thickness of the laminate layer is minimized.

Figure 6:
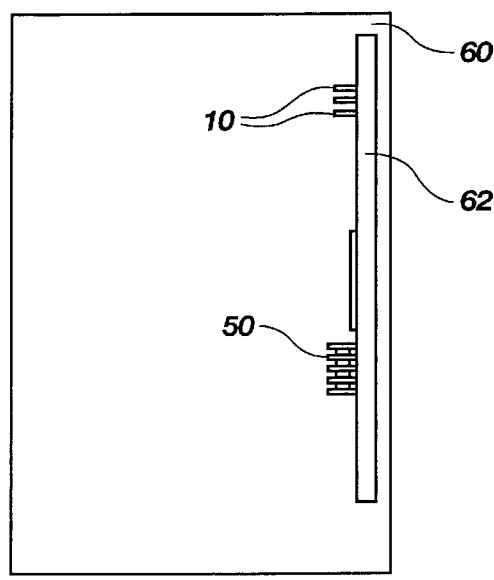
FIG. 6 is a schematic representation of the present invention in a computer.

FIG. 6 illustrates a computer 60 including a circuit board 62. Semiconductor device 10 and laminate module 50 are attached to circuit board 62 in a manner which establishes an electronic connection between the semiconductor devices and the circuit board. Thus, with the attachment of semiconductor device 10 and/or laminate module 50 to circuit board 62, the semiconductor device and/or module is operatively associated with computer 60.

Advantageously, the bond pads of the semiconductor device, which are disposed adjacent an edge thereof, may be directly connected to corresponding terminals on a carrier substrate. Thus, the additional impedance that is typically generated by package leads is significantly reduced. The placement of bond pads on the semiconductor device also facilitates the substantial vertical mounting arrangement of the semiconductor device to a carrier substrate, which, when combined with a convection-type air circulation system, facilitates heat transfer away from the semiconductor device. Preferably, the semiconductor device is bare or minimally packaged, reducing the space consumption thereof relative to vertical surface mount packages and horizontally mountable semiconductor devices and packages. Further, fabrication of the device requires no additional steps relative to the fabrication of many similar semiconductor devices in the prior art. The assembly method of the present invention orients the semiconductor device perpendicularly relative to the carrier substrate.

Although the foregoing description contains many specificities, these should not be construed as limiting the scope of the present invention, but merely as providing illustrations of some of the presently preferred embodiments. Similarly, other embodiments of the invention may be devised which do not depart from the spirit or scope of the present invention, indicated by the appended claims and their equivalents.

What is claimed is:

1. A vertical surface mount semiconductor device, comprising:
   a semiconductor device including an edge, an active surface, and a back side opposite said active surface;
   a plurality of bond pads disposed on said active surface proximate said edge; and
   selected ones of said bond pads having thereon a conductive bump adapted to form a conductive joint in contact with a corresponding terminal of a substrate upon substantially vertical orientation of said semiconductor device on said substrate.

2. The vertical surface mount semiconductor device of claim 1, further comprising a support layer.

3. The vertical surface mount semiconductor device of claim 1, further comprising a support footing formed adjacent said edge.

4. The vertical surface mount semiconductor device of claim 1, further comprising a laminate which connectively bonds said semiconductor device to an adjacent semiconductor device.

5. The vertical surface mount semiconductor device of claim 2, wherein said support layer is disposed on at least a portion of said back side of said semiconductor device.

6. The vertical surface mount semiconductor device of claim 3, wherein said support footing is disposed on said back side of said semiconductor device.

7. The vertical surface mount semiconductor device of claim 3, wherein said support footing is disposed on said active surface of said semiconductor device.

8. A vertical surface mount semiconductor device which mounts directly to a carrier substrate, comprising:
   a semiconductor device including an edge, an active surface, a back side opposite said active surface and a plurality of circuit traces;
   a plurality of bond pads disposed on said active surface proximate said edge, some of said plurality of bond pads contacting one of said plurality of circuit traces, selected ones of said bond pads each having thereon a conductive bump adapted to form a conductive joint with a corresponding terminal of said carrier substrate upon substantially perpendicular disposal of said semiconductor device on the carrier substrate; and
   a support member, at least a portion of said support member being disposed on said semiconductor device proximate said edge.

9. The vertical surface mount semiconductor device of claim 8, wherein said support member is selected from the group consisting of support footings and support layers.

10. The vertical surface mount semiconductor device of claim 8, wherein said support member is disposed on said back side of said semiconductor device.

11. A chip-on-board assembly, comprising:
    a carrier substrate including a plurality of terminals;
    a semiconductor device including an active surface, a back side opposite said active surface, an edge, and a plurality of active bond pads disposed on said active surface proximate said edge; each of said active bond pads corresponding to one of said plurality of terminals, said semiconductor device being perpendicularly disposed on said carrier substrate; and
    an electrically conductive joint disposed in a substantially perpendicular joint formed between each of said plurality of active bond pads and said corresponding one of said plurality of terminals.

12. The chip-on-board assembly of claim 11, further comprising a bump of electrically conductive material formed on each of said bond pads.

13. The chip-on-board assembly of claim 11, further comprising a support member disposable between said semiconductor device and said carrier substrate.

14. The chip-on-board assembly of claim 11, wherein said semiconductor device is laminated to an adjacent semiconductor device.

15. The chip-on-board assembly of claim 13, wherein said support member is selected from the group consisting of support footings and support layers.

16. The chip-on-board assembly of claim 13, wherein said support member is disposed proximate said edge.

17. A computer including a vertically mountable semiconductor device, the semiconductor device comprising:
    a semiconductor die including an edge, an active surface, a back side opposite said active surfaces and a plurality of circuit traces; and
    a plurality of bond pads disposed on said active surface proximate said edge, each of said plurality of bond pads contacting one of said plurality of circuit traces, each of said bond pads having thereon a conductive bump adapted to form a conductive joint in contact with a terminal of a substrate upon substantially perpendicular disposal of said semiconductor device on said substrate.

18. The computer of claim 17, wherein said semiconductor device further comprises a support member.

19. The computer of claim 17, wherein said semiconductor device is laminated to an adjacent semiconductor device.

20. The computer of claim 18, wherein said support member is selected from the group consisting of support footings and support layers.

21. The computer of claim 18, wherein said support member is disposed proximate said edge of said semiconductor device.

* * * * *

UNITED STATES PATENT AND TRADEMARK OFFICE
CERTIFICATE OF CORRECTION

PATENT NO.    : 6,140,696
DATED         : October 31, 2000
INVENTOR(S)   : Larry D. Kinsman It is certified that error appears in the above-identified patent and that said Letters Patent is hereby corrected as shown below:

Title page,
Item [57], ABSTRACT,
Line 15, after "and" and before "respective" insert -- its --

Column 3,
Line 57, after "connected" and before "the" insert -- to --

Column 5,
Line 53, after "said" and before "bond" insert -- plurality of --

Column 6,
Lines 18 and 47, after "said" and before "bond" insert -- plurality of --
Line 37, after "said" and before "active" insert -- plurality of --
Line 62, change "surfaces" to -- surface, --

Column 7,
Line 1, after "said" and before "bond" insert -- plurality of --

Signed and Sealed this

Seventh Day of June, 2005

JON W. DUDAS
*Director of the United States Patent and Trademark Office*